(12) United States Patent
Philipp et al.

(10) Patent No.: US 7,545,019 B2
(45) Date of Patent: Jun. 9, 2009

(54) INTEGRATED CIRCUIT INCLUDING LOGIC PORTION AND MEMORY PORTION

(75) Inventors: Jan Boris Philipp, Peekskill, NY (US); Thomas Happ, Tarrytown, NY (US); Thomas Nirschl, Essex Junction, VT (US)

(73) Assignee: Qimonda North America Corp., Cary, NC (US)

( * ) Notice: Subject to any disclaimer, the term of this patent is extended or adjusted under 35 U.S.C. 154(b) by 61 days.

(21) Appl. No.: 11/759,528

(22) Filed: Jun. 7, 2007

(65) Prior Publication Data
US 2008/0304311 A1    Dec. 11, 2008

(51) Int. Cl.
*H01L 29/00* (2006.01)
(52) U.S. Cl. .............. 257/503; 257/508; 257/528; 257/536; 257/537; 257/390; 257/907; 257/910; 365/63; 365/72; 365/103; 365/104; 365/105
(58) Field of Classification Search .......... 257/390, 257/503, 508, 528, 536, 537, 907, 910; 365/63, 365/72, 103, 104, 105
See application file for complete search history.

(56) References Cited

U.S. PATENT DOCUMENTS

| | | | |
|---|---|---|---|
| 5,714,768 A | | 2/1998 | Ovshinsky et al. |
| 6,200,848 B1 * | | 3/2001 | Lin et al. ............. 438/241 |
| 6,333,221 B1 * | | 12/2001 | Lee .................. 438/239 |
| 7,038,261 B2 | | 5/2006 | Horii |
| 7,053,431 B2 | | 5/2006 | Ogiwara |
| 2003/0168715 A1 * | | 9/2003 | Bae ................ 257/529 |
| 2004/0021168 A1 * | | 2/2004 | Himeno et al. ...... 257/314 |
| 2005/0226041 A1 * | | 10/2005 | Nejad et al. ......... 365/158 |
| 2005/0265082 A1 * | | 12/2005 | Campbell et al. ..... 365/189.01 |

FOREIGN PATENT DOCUMENTS

DE    102005001253    7/2006

OTHER PUBLICATIONS

"OUM—180 nm Nonvolatile Memory Cell Element Technology for Stand Alone and Embedded Applications", Stefan Lai, et al., Intel Corporation (4 pgs.).
"Current Status of the Phase Change Memory and its Future", Stefan Lai, Intel Corporation, IEEE 2003 (4 pgs.).
"Phase-Change Chalcogenide Nonvolatile RAM Completely Based on CMOS Technology", Y.N. Hwang, et al., IEEE 2003 (3 pgs.).
"OUM, Ovonic Unified Memory", ECD Ovonics, Research Report, http://www.ovonics.com/PDFs/Elec_Memory_Research_Report/OUM.pdf, 1999 (80 pgs.).
"A Novel Cell Technology Using N-doped GeSbTe Films for Phase Change RAM", H. Horii, et al., Samsung Electronics Co., Ltd, (2 pgs.).

(Continued)

*Primary Examiner*—Thanh V Pham
(74) *Attorney, Agent, or Firm*—Dicke, Billig & Czaja, PLLC

(57) ABSTRACT

An integrated circuit includes a logic portion including M conductive layers, a memory portion including N conductive layers, and at least one common top conductive layer over the logic portion and the memory portion. M is greater than N.

20 Claims, 14 Drawing Sheets

OTHER PUBLICATIONS

"Full Integration and Reliability Evaluation of Phase-Change RAM Based on .24um-CMOS Technologies", Y.N. Hwang, et al., Symposium on VLSI Technology Digest of Technical Papers, 2003 (2 pgs.).

"Switching Current Scaling and Reliability Evaluation in PRAM", C.W. Jeong, et al., Samsung Electronics Co., Ltd., (2 pgs.).

"Highly Scalable On-axis Confined Cell Structure for High Denisty PRAM beyond 256Mb", S.L. Cho, et al., Symposium of VLSI Technology Digest of Technical Papers, 2005 (2 pgs.).

"Novel uTrench Phase-Change Memory Cell for Embedded and Stand-Alone Non-Volatile Memory Applications", F. Pellizzer, et al., Symposium of VLSI Technology Digest of Technical Papers, 2004 (2 pgs.).

"Highly Manufacturable High Density Phase Change Memory of 64Mb and Beyond", S.J. Ahn, et al., Samsung Electronics Co., Ltd., (4 pgs.).

A 0.1um 1.8V 256Mb 66MHz Synchronous Burst PRAM., Sangeom Kang, et al., ISSCC 2006 (3 pgs.).

* cited by examiner

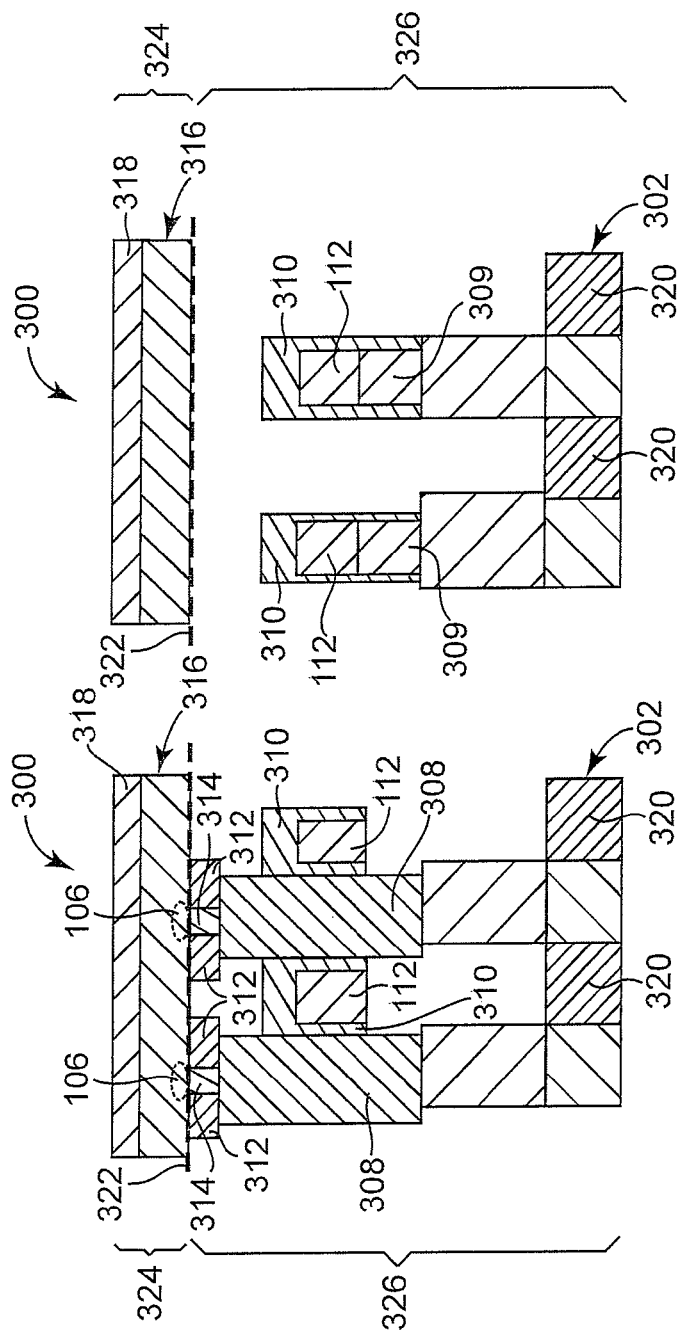
Fig. 9B
Fig. 9C
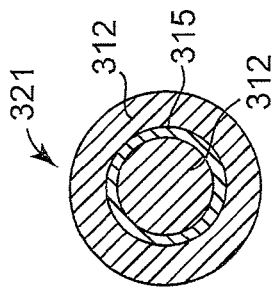
Fig. 10

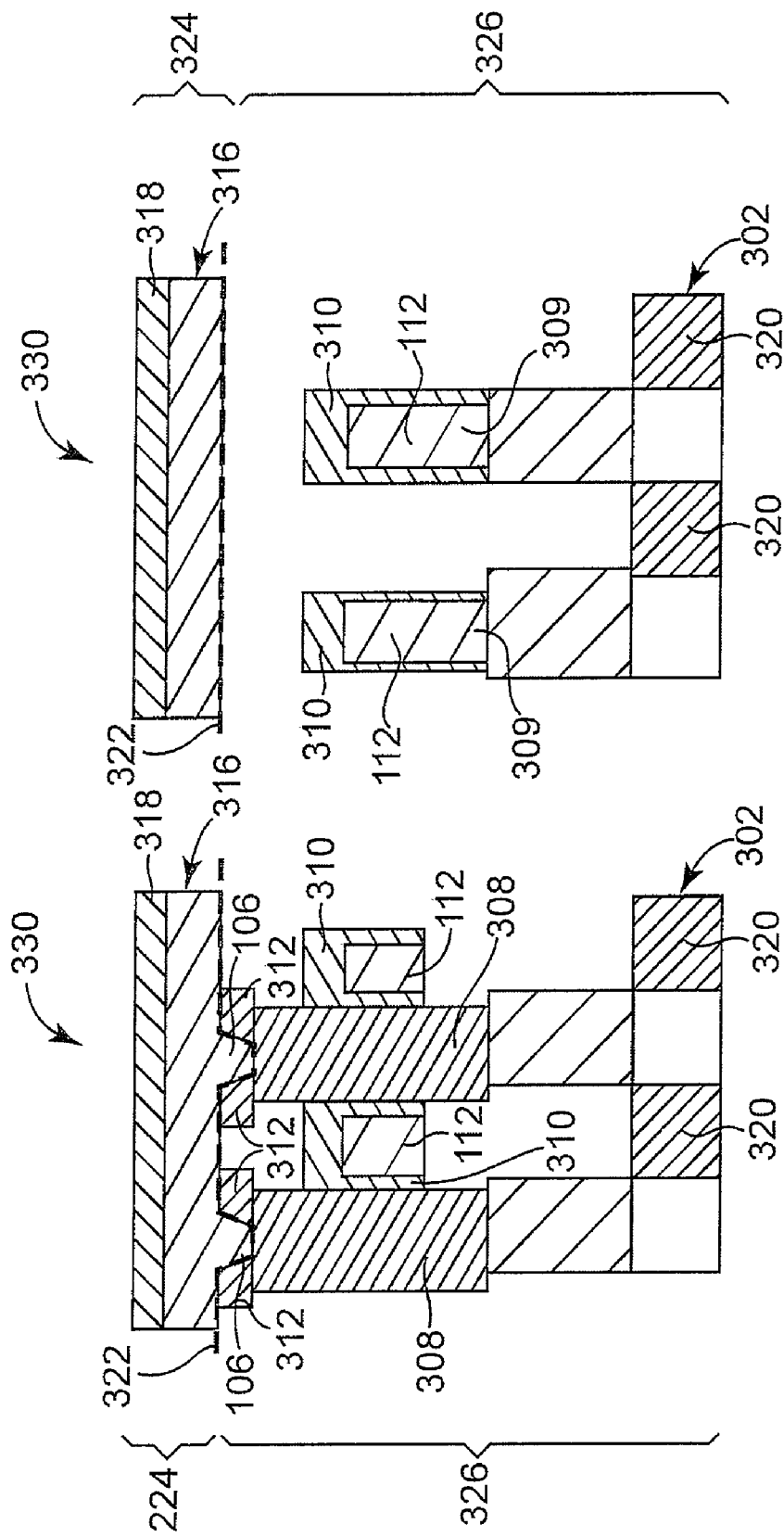

INTEGRATED CIRCUIT INCLUDING LOGIC PORTION AND MEMORY PORTION

BACKGROUND

One type of memory is resistive memory. Resistive memory utilizes the resistance value of a memory element to store one or more bits of data. For example, a memory element programmed to have a high resistance value may represent a logic "1" data bit value and a memory element programmed to have a low resistance value may represent a logic "0" data bit value. Typically, the resistance value of the memory element is switched electrically by applying a voltage pulse or a current pulse to the memory element.

One type of resistive memory is phase change memory. Phase change memory uses a phase change material in the resistive memory element. The phase change material exhibits at least two different states. The states of the phase change material may be referred to as the amorphous state and the crystalline state, where the amorphous state involves a more disordered atomic structure and the crystalline state involves a more ordered lattice. The amorphous state usually exhibits higher resistivity than the crystalline state. Also, some phase change materials exhibit multiple crystalline states, e.g. a face-centered cubic (FCC) state and a hexagonal closest packing (HCP) state, which have different resistivities and may be used to store bits of data. In the following description, the amorphous state generally refers to the state having the higher resistivity and the crystalline state generally refers to the state having the lower resistivity.

Phase changes in the phase change materials may be induced reversibly. In this way, the memory may change from the amorphous state to the crystalline state and from the crystalline state to the amorphous state in response to temperature changes. The temperature changes to the phase change material may be achieved by driving current through the phase change material itself or by driving current through a resistive heater adjacent the phase change material. With both of these methods, controllable heating of the phase change material causes controllable phase change within the phase change material.

A phase change memory including a memory array having a plurality of memory cells that are made of phase change material may be programmed to store data utilizing the memory states of the phase change material. One way to read and write data in such a phase change memory device is to control a current and/or a voltage pulse that is applied to the phase change material. The level of current and/or voltage generally corresponds to the temperature induced within the phase change material in each memory cell.

To achieve higher density phase change memories, a phase change memory cell can store multiple bits of data. Multi-bit storage in a phase change memory cell can be achieved by programming the phase change material to have intermediate resistance values or states, where the multi-bit or multilevel phase change memory cell can be written to more than two states. If the phase change memory cell is programmed to one of three different resistance levels, 1.5 bits of data per cell can be stored. If the phase change memory cell is programmed to one of four different resistance levels, two bits of data per cell can be stored, and so on. To program a phase change memory cell to an intermediate resistance value, the amount of crystalline material coexisting with amorphous material and hence the cell resistance is controlled via a suitable write strategy.

Another type of resistive memory is conductive bridging random access memory (CBRAM). A CBRAM memory cell structure includes a nanostructured solid electrolyte placed between two electrodes. Using a suitable programming strategy, a conductive bridge is formed inside the electrolyte material, substantially reducing the resistance between the electrodes. The conductive bridge can be removed or re-created to store data in the memory cell.

Phase change memory, CBRAM, and other resistive memory technologies are sensitive to the back end of line (BEOL) process due to limited temperature budget and/or oxidization risk. The risk is enhanced in embedded products that use more metal layers than stand alone memory.

For these and other reasons, there is a need for the present invention.

SUMMARY

One embodiment provides an integrated circuit. The integrated circuit includes a logic portion including M conductive layers, a memory portion including N conductive layers, and at least one common top conductive layer over the logic portion and the memory portion. M is greater than N.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 9B illustrates a simplified side view of one embodiment of an array of phase change memory cells including a plate of phase change material.

FIG. 9C illustrates a simplified side view of one embodiment of an array of phase change memory cells including a plate of phase change material.

FIG. 10 illustrates a top cross-sectional view of one embodiment of a ring contact.

FIG. 11B illustrates a simplified side view of one embodiment of an array of phase change memory cells including a plate of phase change material.

FIG. 11C illustrates a simplified side view of one embodiment of an array of phase change memory cells including a plate of phase change material.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
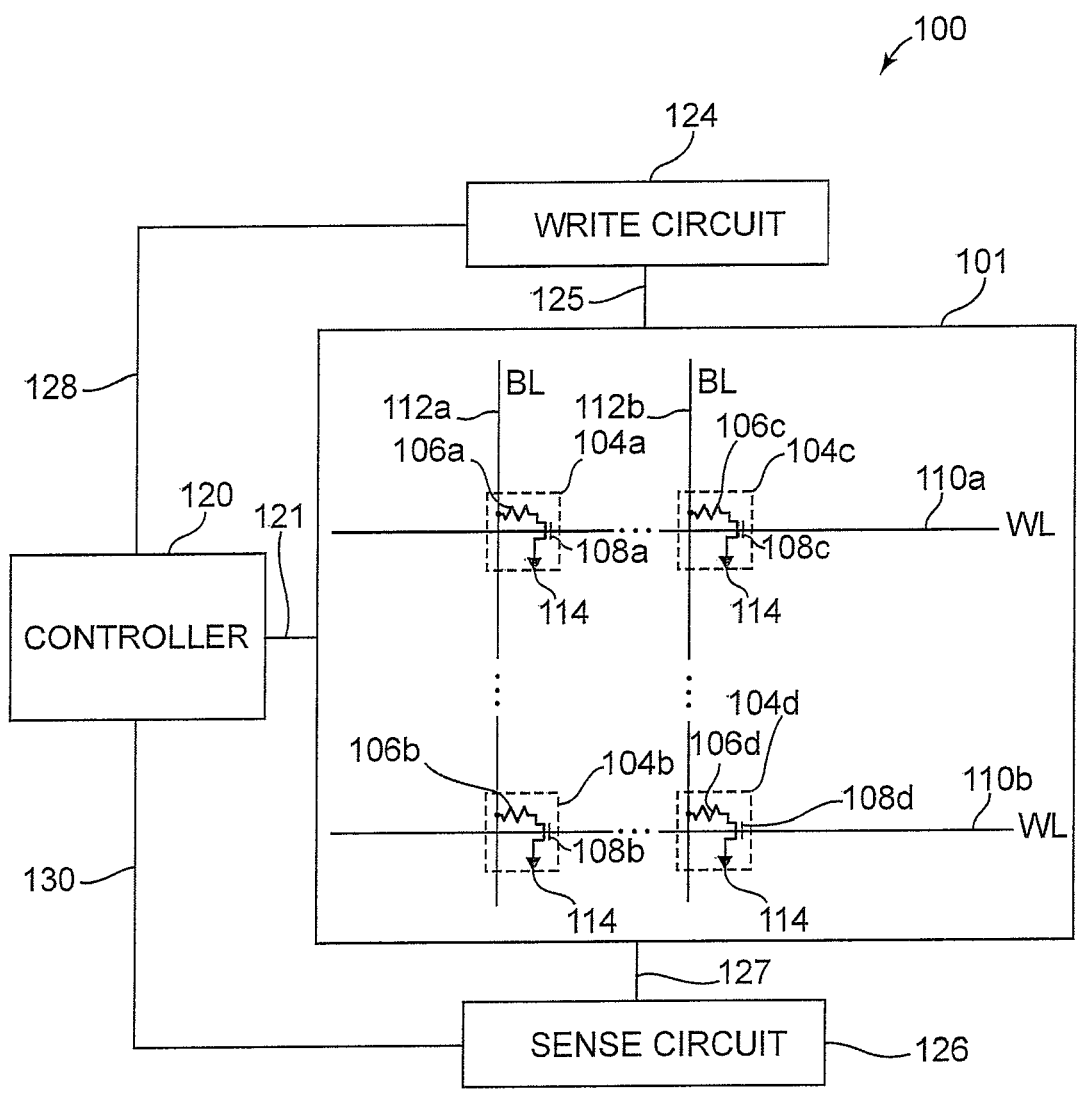
FIG. 1 is a diagram illustrating one embodiment of a memory device.

FIG. 1 is a diagram illustrating one embodiment of a memory device 100. Memory device 100 includes a write circuit 124, a controller 120, a memory array 101, and a sense circuit 126. Memory array 101 includes a plurality of resistive memory cells 104a-104d (collectively referred to as resistive memory cells 104), a plurality of bit lines (BLs) 112a-112b (collectively referred to as bit lines 112), and a plurality of word lines (WLs) 110a-110b (collectively referred to as word lines 110). In one embodiment, resistive memory cells 104 are phase change memory cells. In other embodiments, resistive memory cells 104 are another suitable type of resistive memory cells, such as conductive bridging random access memory (CBRAM) cells.

In one embodiment, memory device 100 is fabricated on a single semiconductor chip. Controller 120, write circuit 124, and sense circuit 126 are formed on a logic portion of the single semiconductor chip and memory array 101 is formed on a memory array portion of the semiconductor chip. In one embodiment, controller 120, write circuit 124, and sense circuit 126 are part of a CPU and memory array 101 provides a cache memory for the CPU. In another embodiment, memory device 100 is a system on a chip where controller 120, write circuit 124, and sense circuit 126 are part of a CPU and memory array 101 provides RAM (volatile memory) and ROM/flash (non-volatile memory) for the system.

Memories using phase change materials or CBRAM materials are sensitive to the back end of line (BEOL) process due to a limited temperature budget of the resistive memory materials and/or oxidation risk. To minimize the effect of the BEOL process, the majority of the logic portion of the semiconductor chip is fabricated before the temperature and/or oxidation sensitive resistive memory portions of the memory device. In addition, the memory array portion is fabricated in the same horizontal plane as the logic portion in the semiconductor chip.

As used herein, the term "electrically coupled" is not meant to mean that the elements must be directly coupled together and intervening elements may be provided between the "electrically coupled" elements.

For simplicity, the description in this disclosure is substantially focused on phase change memory. This is for illustrative purposes only, however, and not intended to limit the scope of the invention. In principle the invention can be applied to any suitable memory technology that is sensitive to the BEOL process.

Memory array 101 is electrically coupled to write circuit 124 through signal path 125, to controller 120 through signal path 121, and to sense circuit 126 through signal path 127. Controller 120 is electrically coupled to write circuit 124 through signal path 128 and to sense circuit 126 through signal path 130. Each resistive memory cell 104 is electrically coupled to a word line 110, a bit line 112, and a common or ground 114. Resistive memory cell 104a is electrically coupled to bit line 112a, word line 110a, and common or ground 114, and resistive memory cell 104b is electrically coupled to bit line 112a, word line 110b, and common or ground 114. Resistive memory cell 104c is electrically coupled to bit line 112b, word line 110a, and common or ground 114, and resistive memory cell 104d is electrically coupled to bit line 112b, word line 110b, and common or ground 114.

Each resistive memory cell 104 includes a resistive element 106 and a transistor 108. While transistor 108 is a field-effect transistor (FET) in the illustrated embodiment, in other embodiments, transistor 108 can be another suitable device such as a bipolar transistor or a 3D transistor structure. In other embodiments, a diode-like structure may be used in place of transistor 108. Resistive memory cell 104a includes resistive memory element 106a and transistor 108a. One side of resistive memory element 106a is electrically coupled to bit line 112a, and the other side of resistive memory element 106a is electrically coupled to one side of the source-drain path of transistor 108a. The other side of the source-drain path of transistor 108a is electrically coupled to common or ground 114. The gate of transistor 108a is electrically coupled to word line 110a.

Resistive memory cell 104b includes resistive memory element 106b and transistor 108b. One side of resistive memory element 106b is electrically coupled to bit line 112a, and the other side of resistive memory element 106b is electrically coupled to one side of the source-drain path of transistor 108b. The other side of the source-drain path of transistor 108b is electrically coupled to common or ground 114. The gate of transistor 108b is electrically coupled to word line 110b.

Resistive memory cell 104c includes resistive memory element 106c and transistor 108c. One side of resistive memory element 106c is electrically coupled to bit line 112b and the other side of resistive memory element 106c is electrically coupled to one side of the source-drain path of transistor 108c. The other side of the source-drain path of transistor 108c is electrically coupled to common or ground 114. The gate of transistor 108c is electrically coupled to word line 110a.

Resistive memory cell 104d includes resistive memory element 106d and transistor 108d. One side of resistive memory element 106d is electrically coupled to bit line 112b and the other side of resistive memory element 106d is electrically coupled to one side of the source-drain path of transistor 108d. The other side of the source-drain path of transistor 108d is electrically coupled to common or ground 114. The gate of transistor 108d is electrically coupled to word line 110b.

In another embodiment, each resistive memory element 106 is electrically coupled to a common or ground 114 and each transistor 108 is electrically coupled to a bit line 112. For example, for resistive memory cell 104a, one side of resistive memory element 106a is electrically coupled to common or ground 114. The other side of resistive memory element 106a is electrically coupled to one side of the source-drain path of transistor 108a. The other side of the source-drain path of transistor 108a is electrically coupled to bit line 112a.

In one embodiment, each resistive memory element 106 is a phase change element that comprises a phase change material that may be made up of a variety of materials in accordance with the present invention. Generally, chalcogenide alloys that contain one or more elements from group VI of the periodic table are useful as such materials. In one embodiment, the phase change material is made up of a chalcogenide compound material, such as GeSbTe, SbTe, GeTe, or AgInSbTe. In another embodiment, the phase change material is chalcogen free, such as GeSb, GaSb, InSb, or GeGaInSb. In other embodiments, the phase change material is made up of any suitable material including one or more of the elements Ge, Sb, Te, Ga, As, In, Se, and S.

Each phase change element may be changed from an amorphous state to a crystalline state or from a crystalline state to an amorphous state under the influence of temperature change. The amount of crystalline material coexisting with amorphous material in the phase change material of one of the phase change elements thereby defines two or more states for storing data within memory device 100. In the amorphous state, a phase change material exhibits significantly higher resistivity than in the crystalline state. Therefore, the two or more states of the phase change elements differ in their electrical resistivity. In one embodiment, the two or more states are two states and a binary system is used, wherein the two states are assigned bit values of "0" and "1". In another embodiment, the two or more states are three states and a ternary system is used, wherein the three states are assigned bit values of "0", "1", and "2". In another embodiment, the two or more states are four states that are assigned multi-bit values, such as "00", "01", "10", and "11". In other embodiments, the two or more states can be any suitable number of states in the phase change material of a phase change element.

Controller 120 includes a microprocessor, microcontroller, or other suitable logic circuitry for controlling the operation of memory device 100. Controller 120 controls read and write operations of memory device 100 including the application of control and data signals to memory array 101 through write circuit 124 and sense circuit 126. In one embodiment, write circuit 124 provides voltage pulses through signal path 125 and bit lines 112 to memory cells 104 to program the memory cells. In other embodiments, write circuit 124 provides current pulses through signal path 125 and bit lines 112 to memory cells 104 to program the memory cells.

Sense circuit 126 reads each of the two or more states of memory cells 104 through bit lines 112 and signal path 127. In one embodiment, to read the resistance of one of the memory cells 104, sense circuit 126 provides current that flows through one of the memory cells 104. Sense circuit 126 then reads the voltage across that one of the memory cells 104. In another embodiment, sense circuit 126 provides voltage across one of the memory cells 104 and reads the current that flows through that one of the memory cells 104. In another embodiment, write circuit 124 provides voltage across one of the memory cells 104 and sense circuit 126 reads the current that flows through that one of the memory cells 104. In another embodiment, write circuit 124 provides current that flows through one of the memory cells 104 and sense circuit 126 reads the voltage across that one of the memory cells 104.

In one embodiment, during a set operation of a phase change memory cell 104a, one or more set current or voltage pulses are selectively enabled by write circuit 124 and sent through bit line 112a to phase change element 106a thereby heating phase change element 106a above its crystallization temperature (but usually below its melting temperature) with word line 110a selected to activate transistor 108a. In this way, phase change element 106a reaches its crystalline state or a partially crystalline and partially amorphous state during this set operation. During a reset operation of phase change memory cell 104a, a reset current or voltage pulse is selectively enabled by write circuit 124 and sent through bit line 112a to phase change element 106a. The reset current or voltage quickly heats phase change element 106a above its melting temperature. After the current or voltage pulse is turned off, phase change element 106a quickly quench cools into the amorphous state or a partially amorphous and partially crystalline state.

Phase change memory cells 104b-104d and other phase change memory cells 104 in memory array 101 are set and reset similarly to phase change memory cell 104a using a similar current or voltage pulse. In other embodiments, for other types of resistive memory cells, write circuit 124 provides suitable programming pulses to program the resistive memory cells 104 to the desired state.

As used herein, the term "metal layer" includes a patterned or non-patterned metal or other conductive material layer with insulation material above and below the metal or other conductive material layer. The metal layer is coupled to other metal layers via contact plugs that pass through the insulation material.

Figure 2:
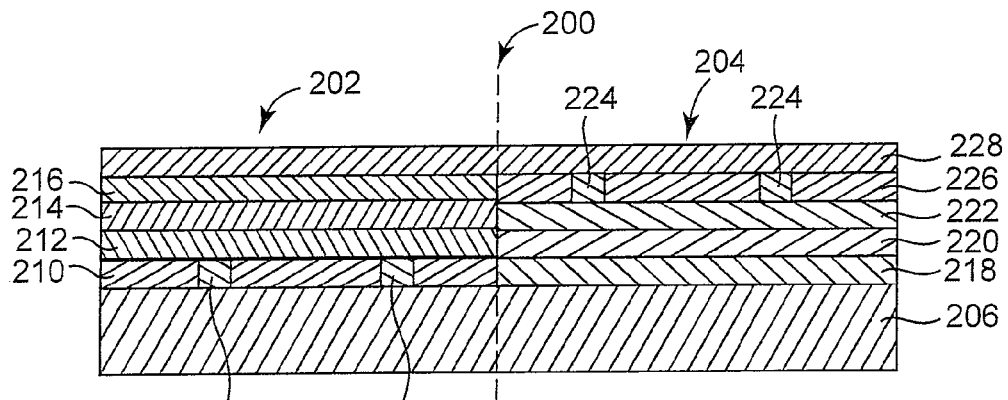
FIG. 2 illustrates a cross-sectional view of one embodiment of a memory device.

FIG. 2 illustrates the cross-sectional view of one embodiment of a memory device 200. Memory device 200 is formed on a single semiconductor chip and includes a logic portion 202 and a memory array portion 204. Logic portion 202 and memory array portion 204 share a common substrate 206 and a common top metal layer 228. Logic portion 202 also includes contact plugs 210, a dielectric material layer 210, a first metal layer 212, a second metal layer 214, and a third metal layer 216. In other embodiments, logic portion 202 includes another suitable number of metal layers. In one embodiment, substrate 206 of logic portion 202 includes active devices (not shown), such as transistors or diodes. Contact plugs 208 electrically couple the active devices formed in substrate 206 to first metal layer 212. Second metal layer 214 is formed over first metal layer 212. Third metal layer 216 is formed over second metal layer 214.

Memory array portion 204 also includes a first memory array layer 218, a second memory array layer 220, a third memory array layer 222, contact plugs 224, and dielectric material layer 226. In other embodiments, memory array portion 204 includes another suitable number of layers. In one embodiment, substrate 206 of memory array portion 204 includes active devices (not shown), such as transistors or diodes. In one embodiment, memory array layer 218 includes contacts or bottom electrodes to electrically couple the active devices formed in substrate 206 to resistive memory storage locations in second memory array layer 220. Second memory array layer 220 is formed over first memory array layer 218. Third memory array layer 222 is formed over second memory array layer 220 and includes contacts or top electrodes to electrically couple the resistive memory storage locations in second memory array layer 220 to contact plugs 224. Contact plugs 224 electrically couple the contacts or top electrodes in third memory array layer 222 to top metal layer 228.

In one embodiment, first memory array layer 218, second memory array layer 220, and third memory array layer 222 provide a phase change memory array. In other embodiments, first memory array layer 218, second memory array layer 220, and third memory array layer 222 provide another suitable resistive memory array or resistivity changing memory array, such as a CBRAM array.

First metal layer 212, second metal layer 214, and third metal layer 216 are deposited and patterned before second memory array layer 220, third memory array layer 222, and contact plugs 224 are formed. Second memory array layer 220, third memory array layer 222, and contact plugs 224 are formed in the same horizontal plane as first metal layer 212, second metal layer 214, and third metal layer 216. In this way, the BEOL process has a minimal affect on memory array portion 204 (in particular the resistive memory storage material) since except for top metal layer 228, logic portion 202 is completed before memory array portion 204. The following FIGS. 3-8 illustrate one embodiment of a process for fabricating memory device 200.

Figure 3:
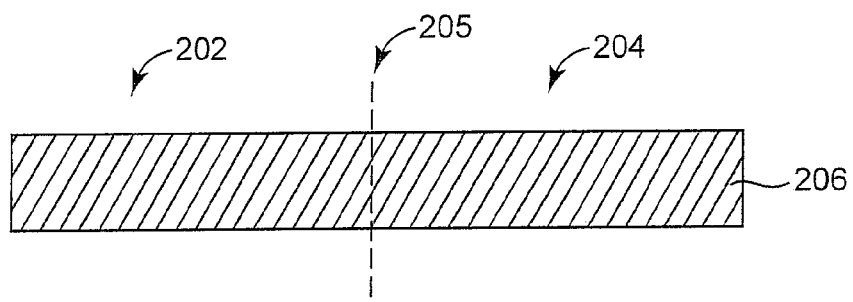
FIG. 3 illustrates a cross-sectional view of one embodiment of a preprocessed wafer including a logic portion and a memory array portion.

FIG. 3 illustrates a cross-sectional view of one embodiment of a preprocessed wafer 205. Preprocessed wafer 205 includes substrate 206. Substrate 206 includes logic portion 202 and memory array portion 204. Transistors, diodes, or other suitable devices (not shown) for fabricating a memory device are formed in substrate 206 for logic portion 202 and memory array portion 204.

Figure 4:
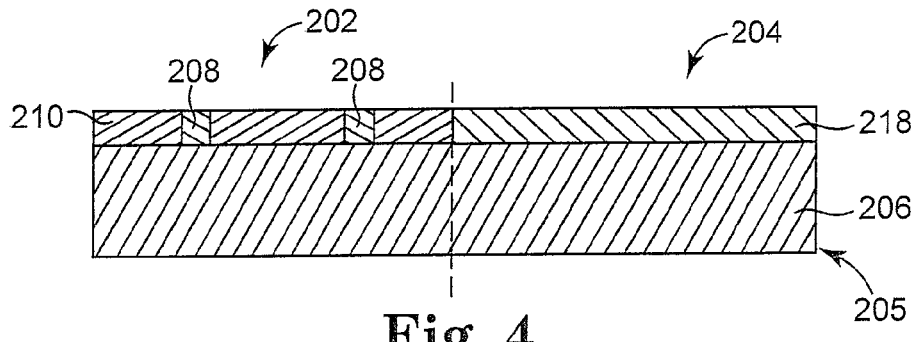
FIG. 4 illustrates a cross-sectional view of one embodiment of the logic portion and the memory array portion after further processing.

FIG. 4 illustrates a cross-sectional view of one embodiment of preprocessed wafer 205, contact plugs 208, dielectric material layer 210, and first memory array layer 218. In one embodiment, dielectric material layer 210 is formed on substrate 206 on logic portion 202. The dielectric material layer is etched to expose portions of substrate 206. Contact material, such as W, Cu, Al, or other suitable contact material is deposited over the exposed portions of substrate 206 to provide contact plugs 208.

First memory array layer 218 is formed on substrate 206 and is coplanar with dielectric material layer 210. In one embodiment, first memory array layer 218 includes contacts or bottom electrodes for electrically coupling active devices formed in substrate 206 to resistive memory storage locations yet to be fabricated in later processing steps. In one embodiment, first memory array layer 218 is formed before dielectric material layer 210 and contact plugs 208. In another embodiment, first memory array layer 218 is formed after dielectric material layer 210 and contact plugs 208 or simultaneously with dielectric material layer 210 and contact plugs 208.

Figure 5:
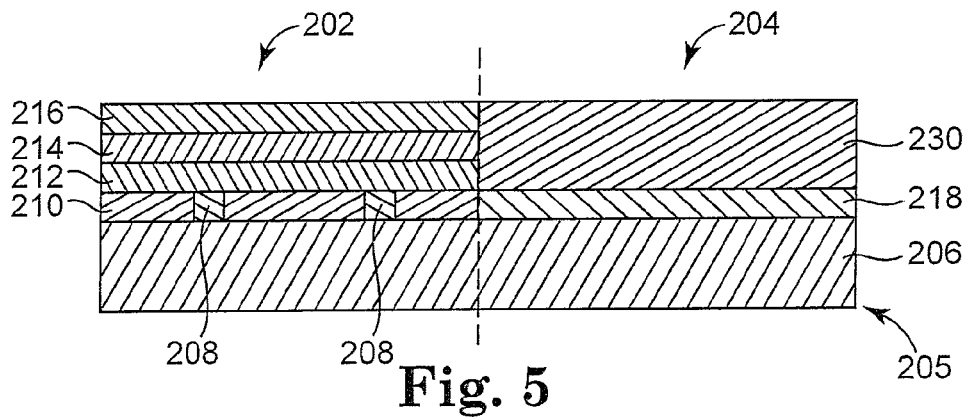
FIG. 5 illustrates a cross-sectional view of one embodiment of the logic portion and the memory array portion after further processing.

FIG. 5 illustrates a cross-sectional view of one embodiment of preprocessed wafer 205, contact plugs 208, dielectric material layer 210, first metal layer 212, second metal layer 214, third metal layer 216, first memory array layer 218, and a dielectric material layer 230. A metal, such as W, Cu, Al or other suitable metal is deposited over dielectric material layer 210 and contact plugs 208 and patterned to provide first metal layer 212. A metal, such as W, Cu, Al or other suitable metal is deposited over first metal layer 212 and patterned to provide second metal layer 214. A metal, such as W, Cu, Al or other suitable metal is deposited over second metal layer 214 and patterned to provide third metal layer 216.

Dielectric material, such as $SiO_2$, fluorosilicate glass (FSG), boro-phosphosilicate glass (BPSG), or other suitable dielectric material is deposited over first memory array layer 218 coplanar with first metal layer 212, second metal layer 214, and third metal layer 216 to provide dielectric material layer 230. In one embodiment, a portion of dielectric material layer 230 is deposited and planarized and/or etched to remove the dielectric material from logic portion 202 before each deposition of the first metal layer 212, second metal layer 214, and third metal layer 216. In other embodiments, other suitable deposition, planarizing, and/or etching techniques are used to fabricate first metal layer 212, second metal layer 214, third metal layer 216, and dielectric material layer 230. In one embodiment, an etch stop material layer is deposited over first memory array layer 218 before dielectric material layer 230 is deposited.

Figure 6:
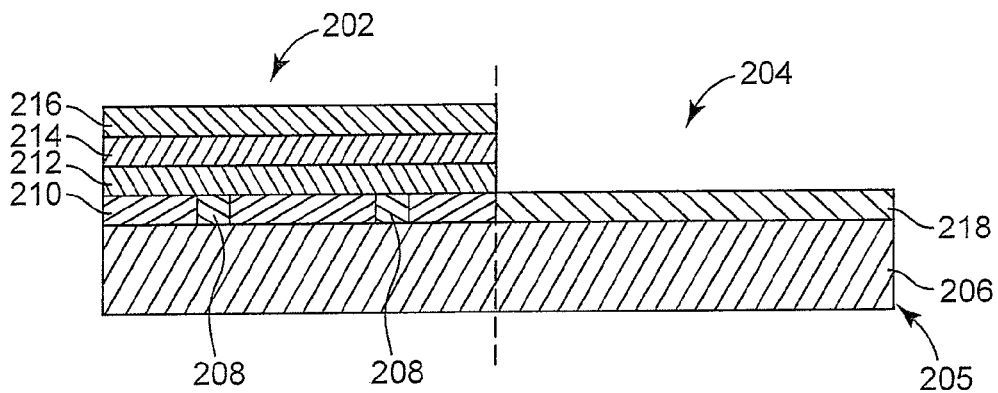
FIG. 6 illustrates a cross-sectional view of one embodiment of the logic portion and the memory array portion after further processing.

FIG. 6 illustrates a cross-sectional view of one embodiment of preprocessed wafer 205, contact plugs 208, dielectric material layer 210, first metal layer 212, second metal layer 214, third metal layer 216, and first memory array layer 218 after etching dielectric material layer 230. Dielectric material layer 230 is removed to expose first memory array layer 218.

Figure 7:
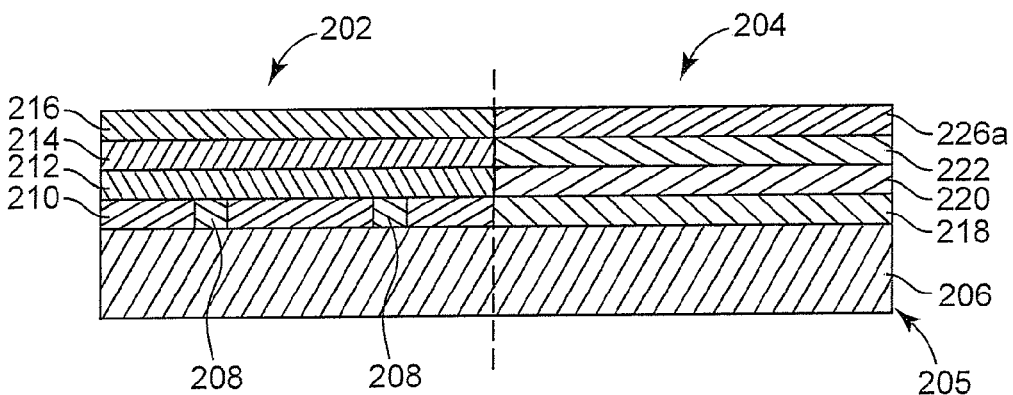
FIG. 7 illustrates a cross-sectional view of one embodiment of the logic portion and the memory array portion after further processing.

FIG. 7 illustrates a cross-sectional view of one embodiment of preprocessed wafer 205, contact plugs 208, dielectric material layer 210, first metal layer 212, second metal layer 214, third metal layer 216, first memory array layer 218, second memory array layer 220, third memory array layer 222, and a dielectric material layer 226a. Second memory array layer 220 is formed over first memory array layer 218. In one embodiment, second memory array layer 220 includes resistive memory material for storing data. In one embodiment, the resistive memory material includes phase change material, CBRAM active material, or other suitable resistive memory material.

Third memory array layer 222 is formed over second memory array layer 220. In one embodiment, third memory array layer 222 includes contacts or top electrodes contacting the resistive memory elements formed within second memory array layer 220. Dielectric material, such as $SiO_2$, FSG, BPSG, or other suitable dielectric material is deposited over third memory array layer 222 to provide dielectric material layer 226a. Second memory array layer 220, third memory array layer 222, and dielectric material layer 226a are coplanar with first metal layer 212, second metal layer 214, and third metal layer 216.

Figure 8:
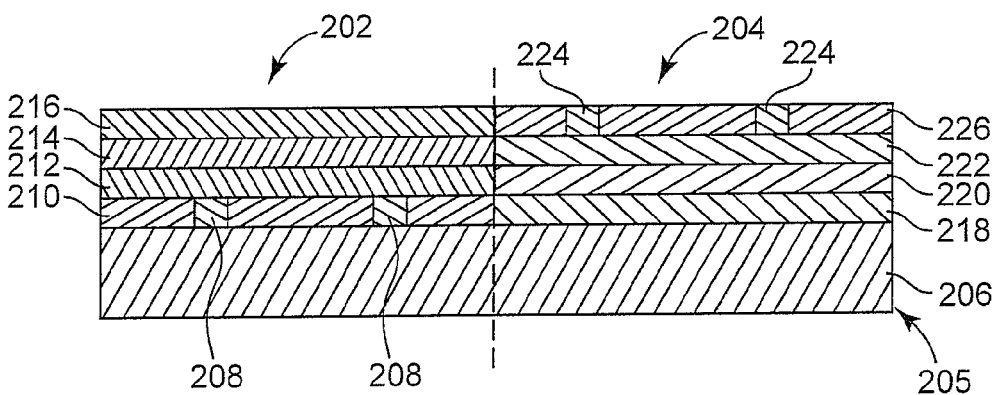
FIG. 8 illustrates a cross-sectional view of one embodiment of the logic portion and the memory array portion after further processing.

FIG. 8 illustrates a cross-sectional view of one embodiment of preprocessed wafer 205, contact plugs 208, dielectric material layer 210, first metal layer 212, second metal layer 214, third metal layer 216, first memory array layer 218, second memory array layer 220, third memory array layer 222, contact plugs 224, and dielectric material layer 226. Dielectric material layer 226a is etched to expose portions of third memory array layer 222. Contact material, such as W, Cu, Al, TiN, TaN, TiSiN, TaSiN, or other suitable contact material is deposited over the exposed portions of third memory array layer 222 to provide contact plugs 224.

A metal, such as W, Cu, Al, or other suitable metal is deposited over third metal layer 216, dielectric material layer 226, and contact plugs 224 to provide top metal layer 228 and memory device 200 as previously described and illustrated with reference to FIG. 2. As illustrated in FIGS. 3-8, the majority of logic portion 202, including first metal layer 212, second metal layer 214, and third metal layer 216, is fabricated before second memory array layer 220 and third memory array layer 222. Therefore, the BEOL process, which includes contact plugs 224 and top metal layer 228, is minimized. With the BEOL process minimized, the BEOL process has a minimal impact on the temperature budget and reduces the oxidation risk of the resistive memory material in memory array portion 204.

Figure 9A:
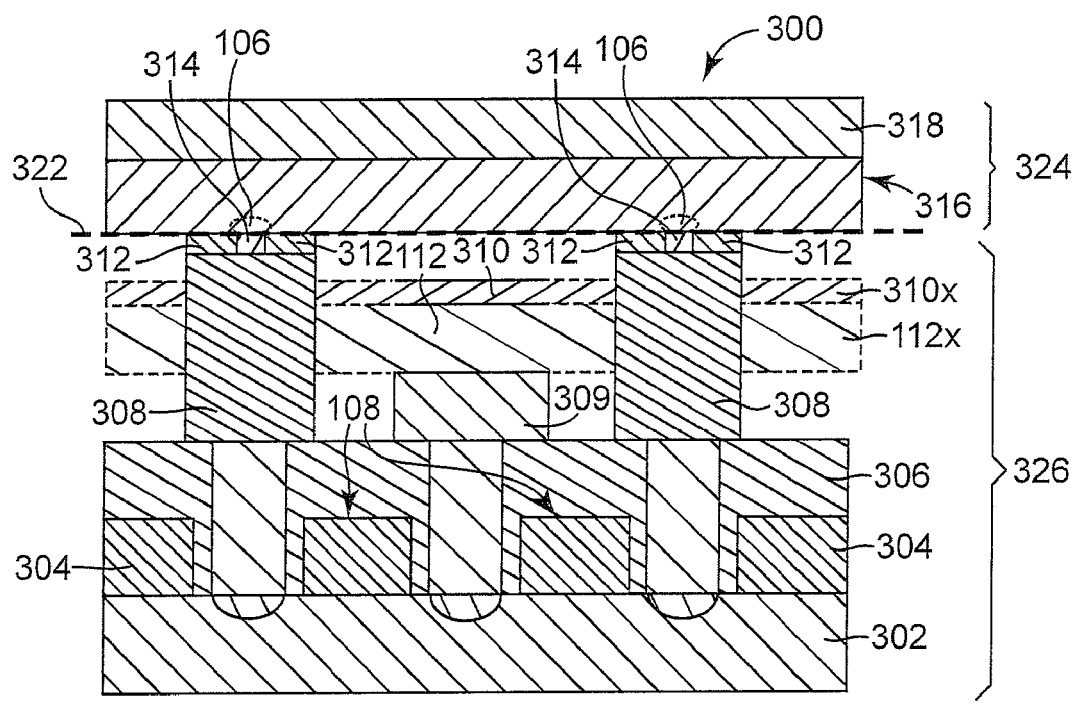
FIG. 9A illustrates a simplified side view of one embodiment of an array of phase change memory cells including a plate of phase change material.

FIG. 9A illustrates a simplified side view of one embodiment of an array of phase change memory cells 300 including a conductive plate 318 and a plate of phase change material 316. FIG. 9B illustrates a simplified side view of one embodiment of array of phase change memory cells 300 perpendicular to the view illustrated in FIG. 9A and through a phase change element 106. FIG. 9C illustrates another simplified side view of one embodiment of array of phase change memory cells 300 perpendicular to the view illustrated in FIG. 9A and through a bit line 112. In one embodiment, array of phase change memory cells 300 includes an array of mushroom or heater phase change memory cells.

Array of phase change memory cells 300 includes substrate 302 including shallow trench isolation (STI) 320, transistors 108, isolation gates 304, conductive plate 318, phase change material plate 316 including phase change elements 106, insulation material 312, heater contacts 314, phase change element contacts 308, bit line contacts 309, bit lines 112, and dielectric material 306 and 310. Dielectric material 310x and bit line 112x are part of dielectric material 310 and bit line 112 but are located behind phase change element contacts 308.

Transistors 108 for selecting phase change elements 106 are formed on substrate 302. The gates of transistors 108 are electrically coupled to word lines 110. Isolation gates 304 are formed on substrate 302 between transistors 108. Dielectric material 306 is deposited over transistors 108 and isolation gates 304. In one embodiment, dielectric material 306 and dielectric material 310, which caps bit lines 112, includes SiN or another suitable material. Phase change element contacts 308 electrically couple one side of the source-drain path of each transistor 108 to a heater contact 314. Each heater contact 314 contacts a phase change element 106 within phase change material plate 316. Insulation material 312 laterally surrounds heater contacts 314. Each bit line contact 309 electrically couples the other side of the source-drain path of each transistor 108 to a bit line 112. Plate of phase change material 316 contacts conductive plate 318.

During fabrication of array of phase change memory cells 300, phase change material is deposited over an insulation material 312 and heater contacts 314. A phase change element 106 is formed at each intersection of the phase change material and a heater contact 314.

The portions of memory device 300 under dashed line 322 as indicated at 326 are processed before the logic BEOL. The portions of memory device 300 above dashed line 322 as indicated at 324 including plate of phase change material 316 and conductive plate 318 are processed after the logic BEOL. In this way, the BEOL process has a minimal impact on the temperature budget and reduces the oxidation risk of plate of phase change material 316.

FIG. 10 illustrates a top cross-sectional view of one embodiment of a ring contact 321. In one embodiment, ring contact 321 is used in place of heater contact 314 illustrated in FIGS. 9A and 9B. Ring contact 321 includes a cylindrical core of insulation material 312. The cylindrical core of insulation material is surrounded by a ring of heater contact material 315. The ring of heater contact material 315 is surrounded by additional insulation material 312.

Figure 11A:
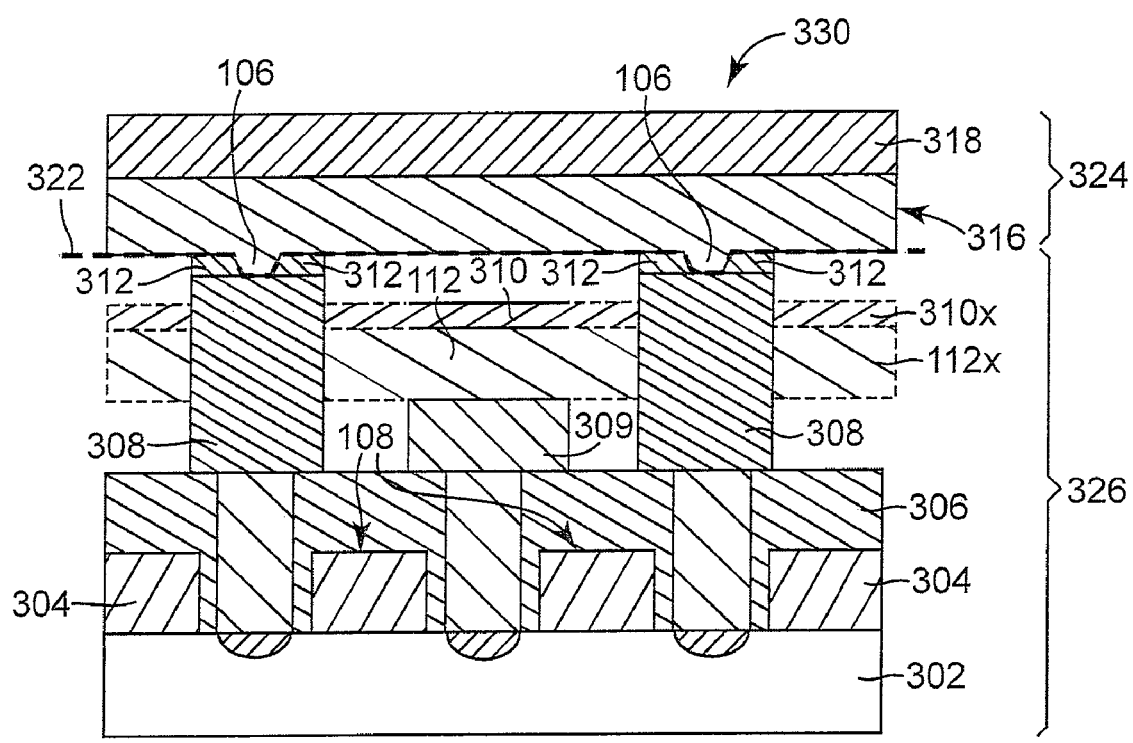
FIG. 11A illustrates a simplified side view of one embodiment of an array of phase change memory cells including a plate of phase change material.

FIG. 11A illustrates a simplified side view of one embodiment of an array of phase change memory cells 330 including a conductive plate 318 and a plate of phase change material 316. FIG. 11B illustrates a simplified side view of one embodiment of array of phase change memory cells 330 perpendicular to the view illustrated in FIG. 11A and through a phase change element 106. FIG. 11C illustrates another simplified side view of one embodiment of array of phase change memory cells 330 perpendicular to the view illustrated in FIG. 11A and through a bit line 112.

Array of phase change memory cells 330 includes substrate 302 including STI 320, transistors 108, isolation gates 304, conductive plate 318, insulation material 312, phase change elements 106, phase change element contacts 308, bit line contacts 309, bit lines 112, and dielectric material 306 and 310. Dielectric material 310x and bit line 112x are part of dielectric material 310 and bit line 112 but are located behind phase change element contacts 308.

Transistors 108 for selecting phase change elements 106 are formed on substrate 302. The gates of transistors 108 are electrically coupled to word lines 110. Isolation gates 304 are formed on substrate 302 between transistors 108. Dielectric material 306 is deposited over transistors 108 and isolation gates 304. Phase change element contacts 308 electrically couple one side of the source-drain path of each transistor 108 to a phase change element 106, and bit line contacts 309 electrically couple the other side of the source-drain path of each transistor 108 to a bit line 112. Insulation material 312 laterally surrounds phase change elements 106.

In one embodiment, dielectric material 306 and dielectric material 310, which caps bit lines 112, includes SiN or another suitable material. Plate of phase change material 316 electrically couples phase change elements 106 to conductive plate 318.

During fabrication of array of phase change memory cells 330, phase change material is deposited over an insulation material layer that has had V-shaped openings etched into it to expose portions of contacts 308. In one embodiment, the V-shaped openings are tapered vias etched into the insulation material layer. In another embodiment, the V-shaped openings are trenches etched into the insulation material layer. In any case, the phase change material fills the openings and covers the insulation material layer. A phase change element 106 is formed at each intersection of the phase change material and a contact 308.

The portions of memory device 330 under dashed line 322 as indicated at 326 are processed before the logic BEOL. The portions of memory device 330 above dashed line 322 as indicated at 324 including plate of phase change material 316 and conductive plate 318 are processed after the logic BEOL. In this way, the BEOL process has a minimal impact on the temperature budget and reduces the oxidation risk of plate of phase change material 316.

Figure 12A:
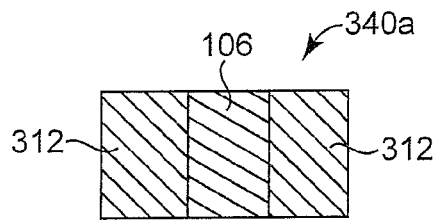
FIG. 12A illustrates a cross-sectional view of one embodiment of a storage location.

FIG. 12A illustrates a cross-sectional view of one embodiment of a storage location 340*a*. Storage location 340*a* can be used in array of phase change memory cells 330 (FIGS. 11A-11C). Storage location 340*a* can be electrically coupled between contact 308 and plate of phase change material 316. Storage location 340*a* includes phase change element 106 and insulation material 312. In this embodiment, phase change element 106 is cylindrical in shape and insulation material 312 laterally surrounds phase change element 106.

Figure 12B:
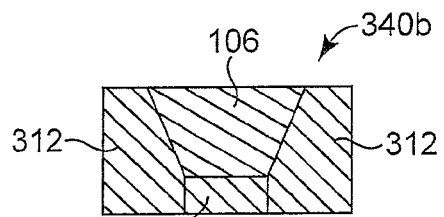
FIG. 12B illustrates a cross-sectional view of another embodiment of a storage location.

FIG. 12B illustrates a cross-sectional view of another embodiment of a storage location 340*b*. Storage location 340*b* can be used in array of phase change memory cells 330 (FIGS. 11A-11C). Storage location 340*b* can be electrically coupled between contact 308 and plate of phase change material 316. Storage location 340*b* includes heater contact 342, phase change element 106, and insulation material 312. In this embodiment, phase change element 106 is V-shaped and heater contact 342 is cylindrical in shape and contacts the bottom of phase change element 106. Insulation material 312 laterally surrounds phase change element 106 and heater contact 342.

Figure 12C:
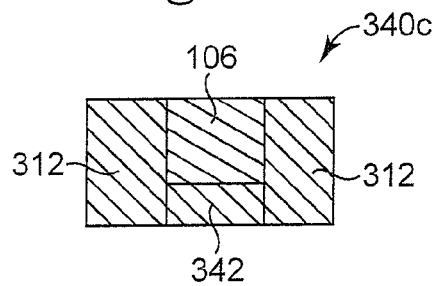
FIG. 12C illustrates a cross-sectional view of another embodiment of a storage location.

FIG. 12C illustrates a cross-sectional view of another embodiment of a storage location 340*c*. Storage location 340*c* can be used in array of phase change memory cells 330 (FIGS. 11A-11C). Storage location 340*c* can be electrically coupled between contact 308 and plate of phase change material 316. Storage location 340*c* includes heater contact 342, phase change element 106, and insulation material 312. In this embodiment, phase change element 106 is cylindrical in shape and heater contact 342 is also cylindrical in shape and contacts the bottom of phase change element 106. Insulation material 312 laterally surrounds phase change element 106 and heater contact 342.

Figure 12D:
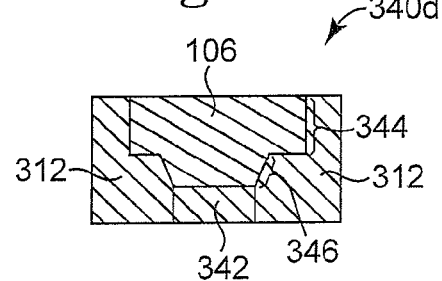
FIG. 12D illustrates a cross-sectional view of another embodiment of a storage location.

FIG. 12D illustrates a cross-sectional view of another embodiment of a storage location 340*d*. Storage location 340*d* can be used in array of phase change memory cells 330 (FIGS. 11A-11C). Storage location 340*d* can be electrically coupled between contact 308 and plate of phase change material 316. Storage location 340*d* includes heater contact 342, phase change element 106, and insulation material 312. In this embodiment, phase change element 106 includes a cylindrical top portion 344 contacting a V-shaped lower portion 346. Heater contact 342 is cylindrical in shape and contacts the bottom of lower portion 346 of phase change element 106. Insulation material 312 laterally surrounds phase change element 106 and heater contact 342.

Figure 12E:
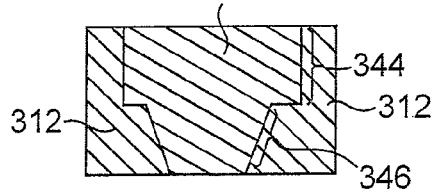
FIG. 12E illustrates a cross-sectional view of another embodiment of a storage location.

FIG. 12E illustrates a cross-sectional view of another embodiment of a storage location 340*e*. Storage location 340*e* can be used in array of phase change memory cells 330 (FIGS. 11A-11C). Storage location 340*e* can be electrically coupled between contact 308 and plate of phase change material 316. Storage location 340*e* includes phase change element 106 and insulation material 312. In this embodiment, phase change element 106 includes a cylindrical top portion 344 contacting a V-shaped lower portion 346. Insulation material 312 laterally surrounds phase change element 106.

Figures 13A, 13B:
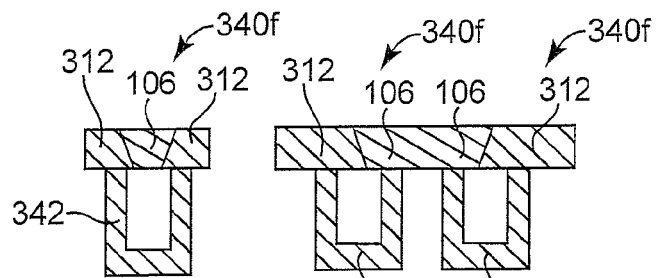
FIG. 13A illustrates a cross-sectional view of another embodiment of a storage location.
FIG. 13B illustrates a perpendicular cross-sectional view of the embodiment of the storage location illustrated in FIG. 13A.

FIG. 13A illustrates a cross-sectional view of another embodiment of two storage locations 340*f*, and FIG. 13B illustrates a perpendicular cross-sectional view of the two storage locations 340*f*. Each storage location 340*f* can be used in array of phase change memory cells 330 (FIGS. 11A-11C). Each storage location 340*f* can be electrically coupled between contact 308 and plate of phase change material 318. Storage locations 340*f* include phase change elements 106, insulation material 312, and heater contacts 342. In this embodiment, there are two phase change elements 106 for each V-shaped phase change portion in insulation material 312. Heater contacts 342 are cup shaped. At the intersection of heater contacts 342 and the phase change material, phase change elements 106 are formed.

Figures 14A, 14B:
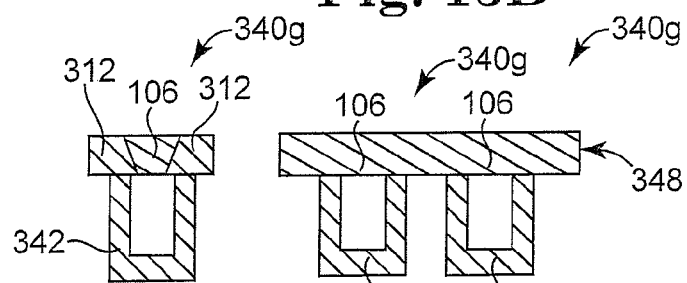
FIG. 14A illustrates a cross-sectional view of another embodiment of a storage location.
FIG. 14B illustrates a perpendicular cross-sectional view of the embodiment of the storage location illustrated in FIG. 14A.

FIG. 14A illustrates a cross-sectional view of another embodiment of two storage locations 340*g*, and FIG. 14B illustrates a perpendicular cross-sectional view of the two storage location 340*g*. Each storage location 340*g* can be used in array of phase change memory cells 330 (FIGS. 11A-11C). Each storage location 340*g* can be electrically coupled between contact 308 and plate of phase change material 316. Storage locations 340*g* include phase change elements 106, insulation material 312, and heater contacts 342. In this embodiment, there are two phase change elements 106 for each V-shaped phase change trench opening in insulation material 312. Heater contacts 342 are cup shaped. At the intersection of heater contacts 342 and the phase change material, phase change elements 106 are formed.

Figure 15:
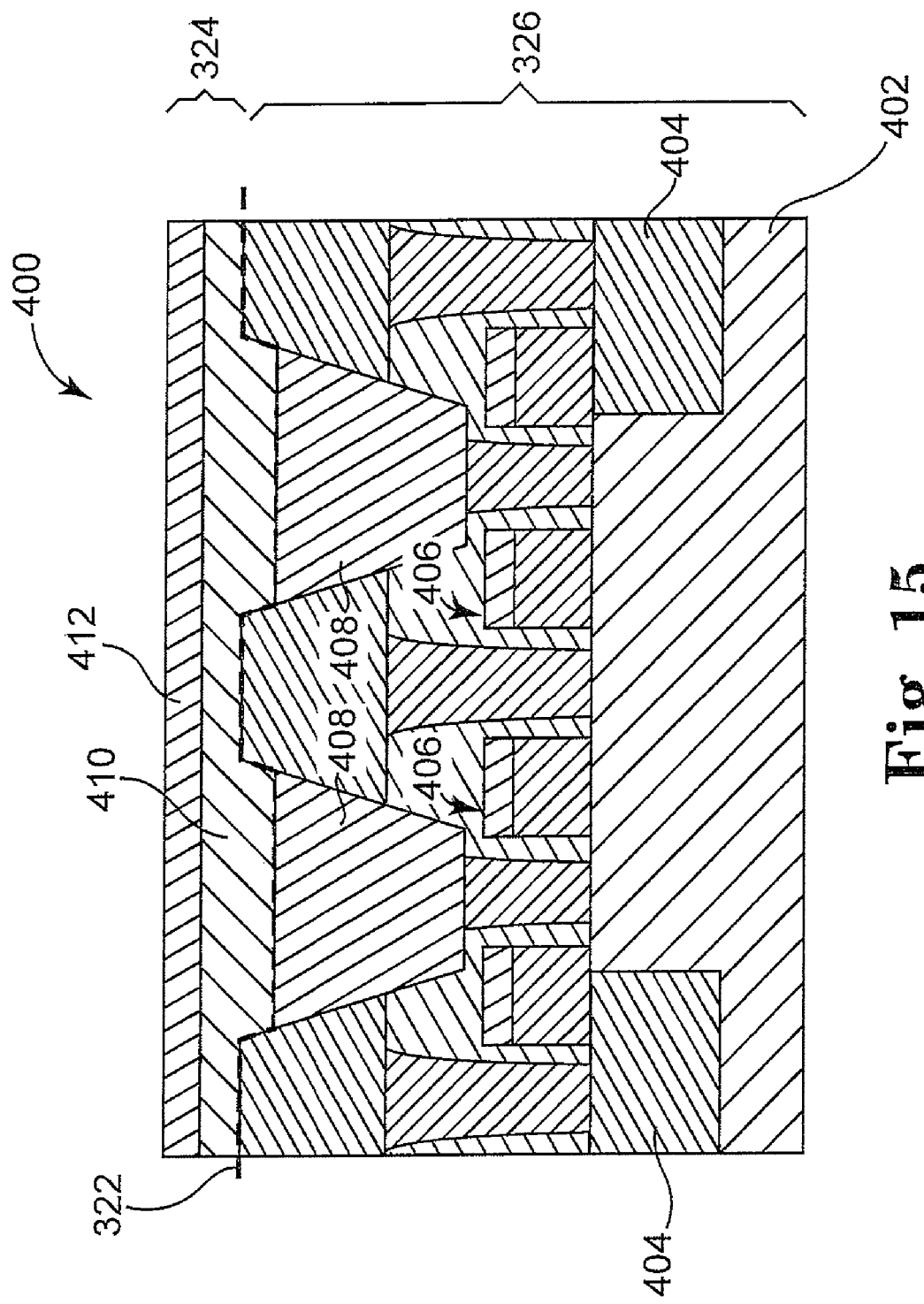
FIG. 15 illustrates a cross-sectional view of one embodiment of a conductive bridging random access memory (CBRAM).

FIG. 15 illustrates a cross-sectional view of one embodiment of a CBRAM 400. CBRAM 400 includes substrate 402 including isolation regions 404, transistors 406, node contacts 408, CBRAM active layer 410, and top metal layer 412. Transistors 406 are formed on substrate 402. The gate of each transistor 406 is electrically coupled to a word line 110. One side of the source-drain path of each transistor 406 is electrically coupled to CBRAM active layer 410 through a node contact 408. The other side of the source-drain path of each transistor 406 is electrically coupled to a bit line 112.

The portions of CBRAM 400 under dashed line 322 as indicated at 326 are processed before the logic BEOL. The portions of CBRAM 400 above dashed line 322 as indicated at 324 including CBRAM active layer 410 and top metal layer 412 are processed after the logic BEOL. In this way, The BEOL process has a minimal impact on the temperature budget and reduces the oxidation risk of CBRAM active layer 410.

Figure 16:
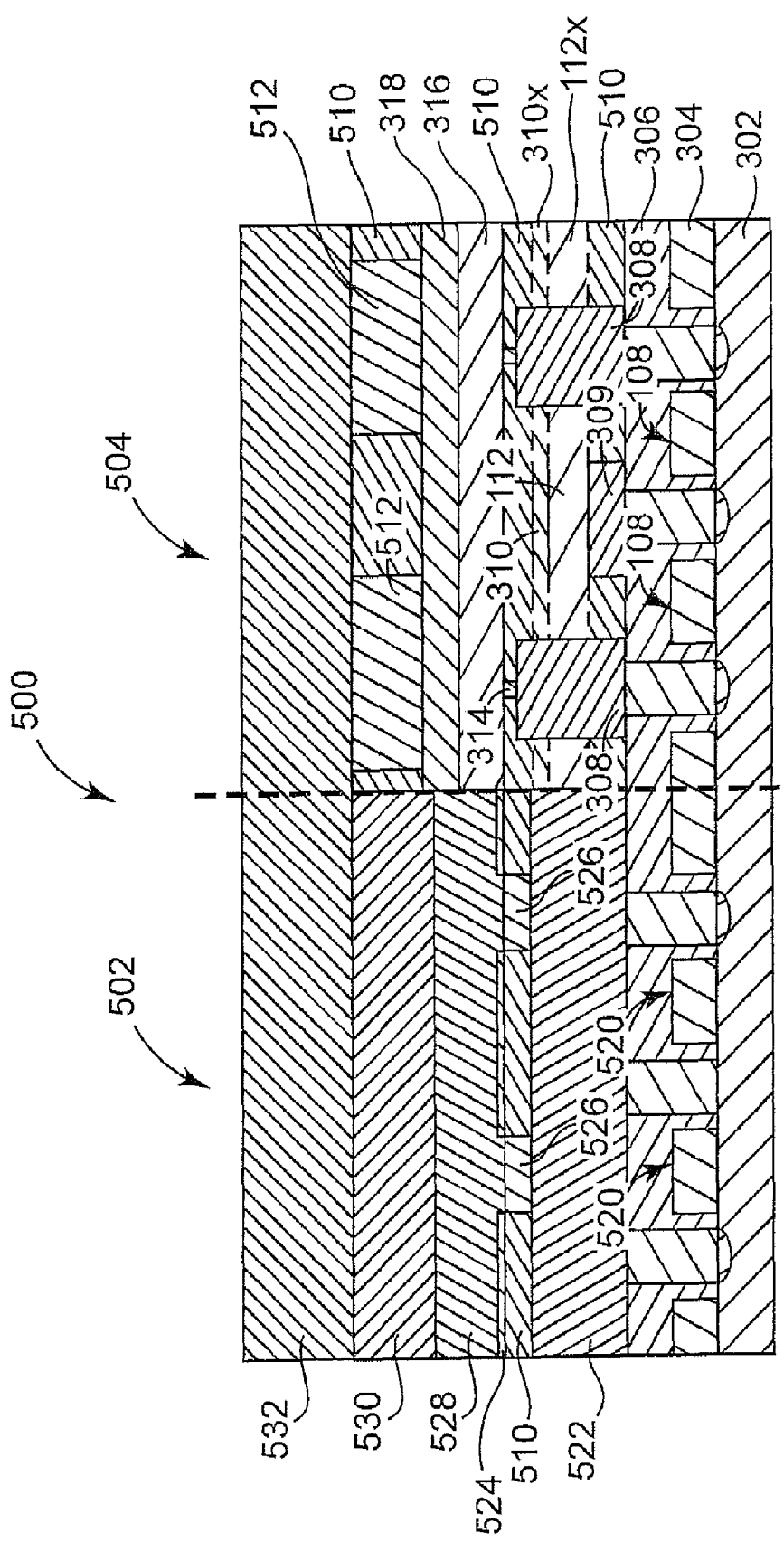
FIG. 16 illustrates a cross-sectional view of one embodiment of a memory device.

FIG. 16 illustrates a cross-sectional view of one embodiment of a memory device 500. Memory device 500 includes logic portion 502 and memory array portion 504. Memory array portion 504 is similar to memory device 300 previously described and illustrated with reference to FIGS. 9A-9C. In addition, memory array portion 504 includes contact plugs 512 within a dielectric material layer 510 to couple a top metal layer 532 to conductive plate 318. Logic portion 502 includes a first metal layer 522, contact plugs 526 in a dielectric material layer 510 to couple first metal layer 522 to a second metal layer 528, an optional etch stop material layer 524 between dielectric material layer 510 and second metal layer 528, and a third metal layer 530. The following FIGS. 17-25 illustrate one embodiment of a process for fabricating memory device 500.

Figure 17:
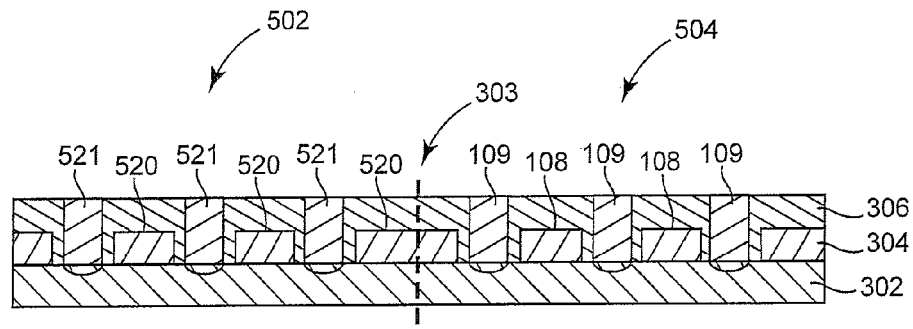
FIG. 17 illustrates a cross-sectional view of one embodiment of a preprocessed wafer including a logic portion and a memory array portion.

FIG. 17 illustrates a cross-sectional view of one embodiment of a preprocessed wafer 303. Preprocessed wafer 303 includes a logic portion 502 and a memory array portion 504. Logic portion 502 and memory array portion 504 share a common substrate 302 and dielectric material layer 306. Logic portion 502 includes transistors 520 and contact plugs 521 formed in substrate 302 and dielectric material layer 306. Memory array portion 504 includes transistors 108, isolation gates 304, and contact plugs 109 formed in substrate 302 and dielectric material layer 306. Dielectric material layer 306 includes SiN or other suitable dielectric material. Contact plugs 521 and 109 include W, Cu, Al, or other suitable contact material.

Figure 18:
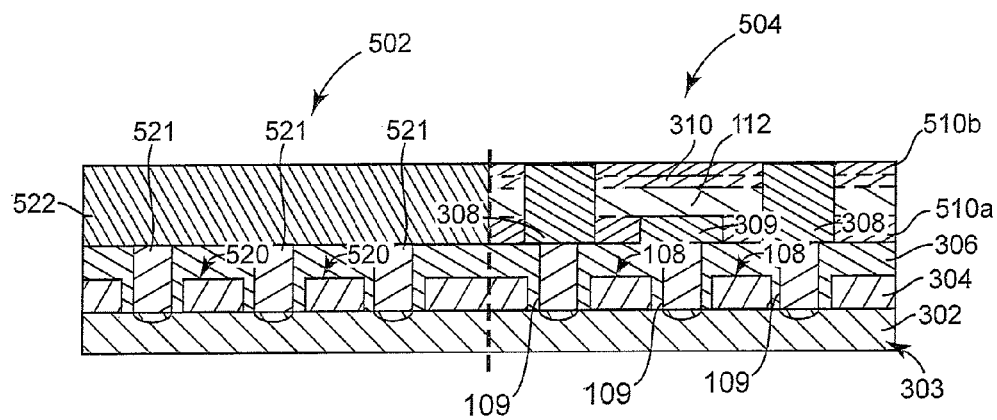
FIG. 18 illustrates a cross-sectional view of one embodiment of the logic portion and the memory array portion after further processing.

FIG. 18 illustrates a cross-sectional view of one embodiment of logic portion 502 and memory array portion 504 after depositing a first metal layer 522 and fabricating phase change element contacts 308, bit line contacts 309, and bit lines 112. A metal, such as W, Cu, Al, or other suitable metal is deposited over dielectric material layer 306 and contact plugs 521 on logic portion 502 and patterned to provide first metal layer 522. In one embodiment, first metal layer 522 includes two or more metal layers.

Dielectric material, such as $SiO_2$, FSG, BPSG, or other suitable dielectric material is deposited over dielectric material layer 306 and contact plugs 109 on memory array portion 504 to provide a dielectric material layer. The dielectric material layer is etched to expose contact plugs 109 and provide dielectric material layer 510a. A contact material, such as TiN, TaN, W, Al, Cu, TiSiN, TaSiN, or other suitable contact material is deposited over contact plugs 109 to provide phase change element contacts 308 and bit line contacts 309. Bit lines 112 capped with dielectric material 110 and are then formed to contact bit line contacts 309. Additional dielectric material, such as $SiO_2$, FSG, BPSG, or other suitable dielectric material is then deposited and planarized and/or etched to provide dielectric material layer 510b. Phase change element contacts 308, bit line contacts 309, and bit lines 112 are formed in the same horizontal plane as first metal layer 522.

Figure 19:
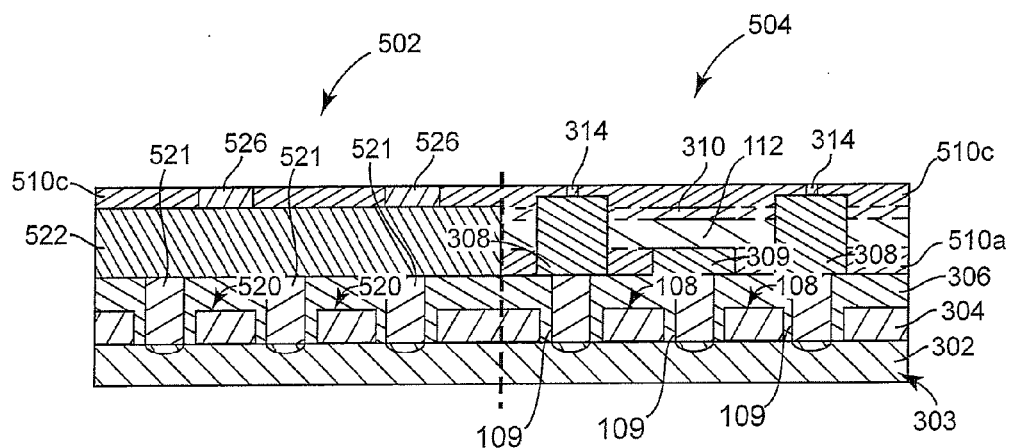
FIG. 19 illustrates a cross-sectional view of one embodiment of the logic portion and the memory array portion after further processing.

FIG. 19 illustrates a cross-sectional view of one embodiment of logic portion 502 and memory array portion 504 after forming contact plugs 526 and heater contacts 314. A dielectric material, such as $SiO_2$, FSG, BPSG, or other suitable dielectric material is deposited over first metal layer 522, phase change element contacts 308, and dielectric material layer 510b to provide a dielectric material layer. The dielectric material layer is etched to expose portions of first metal layer 522 and phase change element contacts 308 to provide dielectric material layer 510c. A contact plug material, such as W, Cu, Al, or other suitable contact plug material is deposited over exposed portions of first metal layer 522 and planarized and/or etched to form contact plugs 526. A heater contact material, such as TiN, TaN, W, Al, Cu, TiSiN, TaSiN, or other suitable heater contact material is deposited over exposed portions of phase change element contacts 308 and planarized and/or etched to form heater contacts 314.

Figure 20:
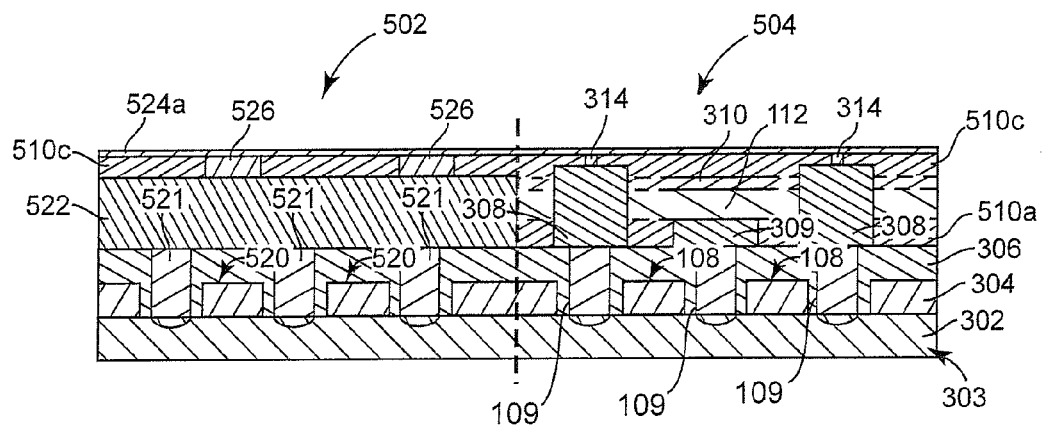
FIG. 20 illustrates a cross-sectional view of one embodiment of the logic portion and the memory array portion after further processing.

FIG. 20 illustrates a cross-sectional view of one embodiment of logic portion 502 and memory array portion 504 after depositing an optional etch stop material layer 524a. An etch stop material, such as SiN or other suitable etch stop material is deposited over exposed portions of dielectric material layer 510c, contact plugs 526, and heater contacts 314 to provide etch stop material stop layer 524a. In one embodiment, etch stop material layer 524a includes a stack of etch stop material layers.

Figure 21:
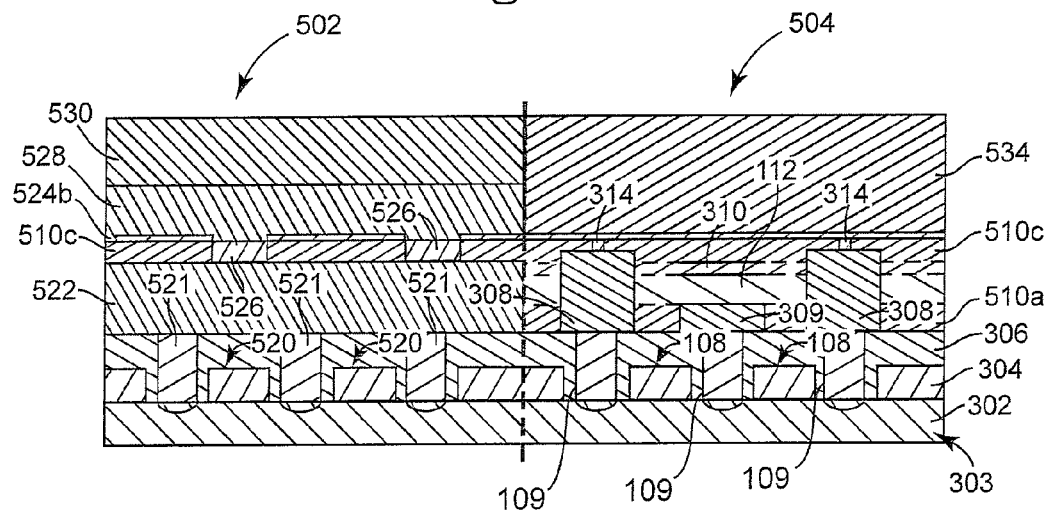
FIG. 21 illustrates a cross-sectional view of one embodiment of the logic portion and the memory array portion after further processing.

FIG. 21 illustrates a cross-sectional view of one embodiment of logic portion 502 and memory array portion 504 after depositing a second metal layer 528, a third metal layer 530, and a dielectric material layer 534. Etch stop material layer 524a is etched to expose contact plugs 526 and to provide etch stop layer 524b. A metal, such as W, Cu, Al, or other suitable metal is deposited over etch stop material layer 524b and contact plugs 526 on logic portion 502 and patterned to provide second metal layer 528. In one embodiment, second metal layer 528 includes two or more metal layers.

A metal, such as W, Cu, Al, or other suitable metal is deposited over second metal layer 528 on logic portion 502 and patterned to provide third metal layer 530. In one embodiment, third metal layer 530 includes two or more metal layers. A dielectric material, such as $SiO_2$, FSG, BPSG, or other suitable dielectric material is deposited over etch stop material layer 524b on memory array portion 504 to provide dielectric material layer 534. Dielectric material layer 534 is deposited in the same horizontal plane as second metal layer 528 and third metal layer 530. In one embodiment, a portion of dielectric material layer 534 is deposited and planarized and/or etched to remove the dielectric material from logic portion 202 before each deposition of the second metal layer 528 and third metal layer 530. In other embodiments, other suitable deposition, planarizing, and/or etching techniques are used to fabricate second metal layer 528, third metal layer 530, and dielectric material layer 534.

Figure 22:
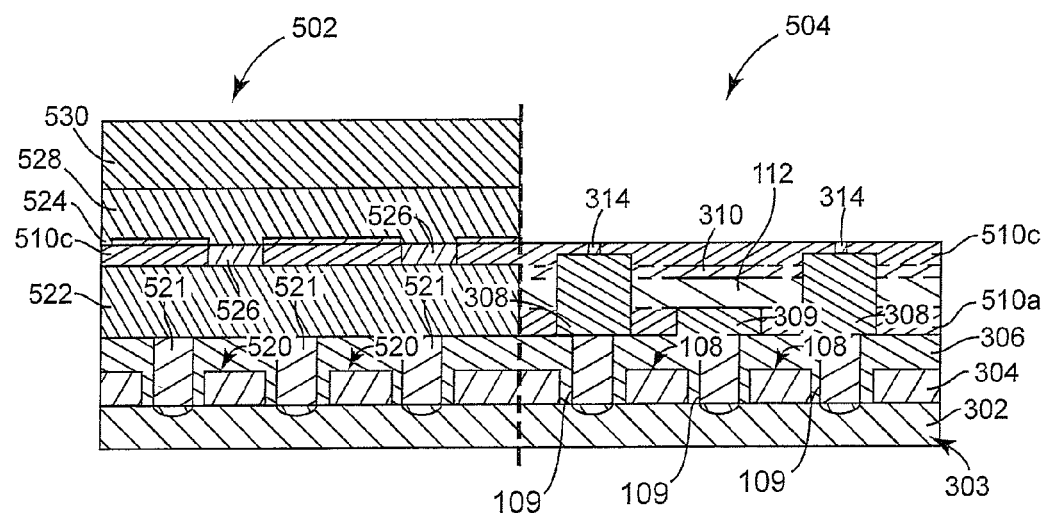
FIG. 22 illustrates a cross-sectional view of one embodiment of the logic portion and the memory array portion after further processing.

FIG. 22 illustrates a cross-sectional view of one embodiment of logic portion 502 and memory array portion 504 after etching dielectric material layer 534 and etch stop material layer 524b. Dielectric material layer 534 is removed to expose etch stop material layer 524b. Etch stop material layer 524b is then etched to expose dielectric material layer 510c and heater contacts 314 and to provide etch stop material layer 524.

Figure 23:
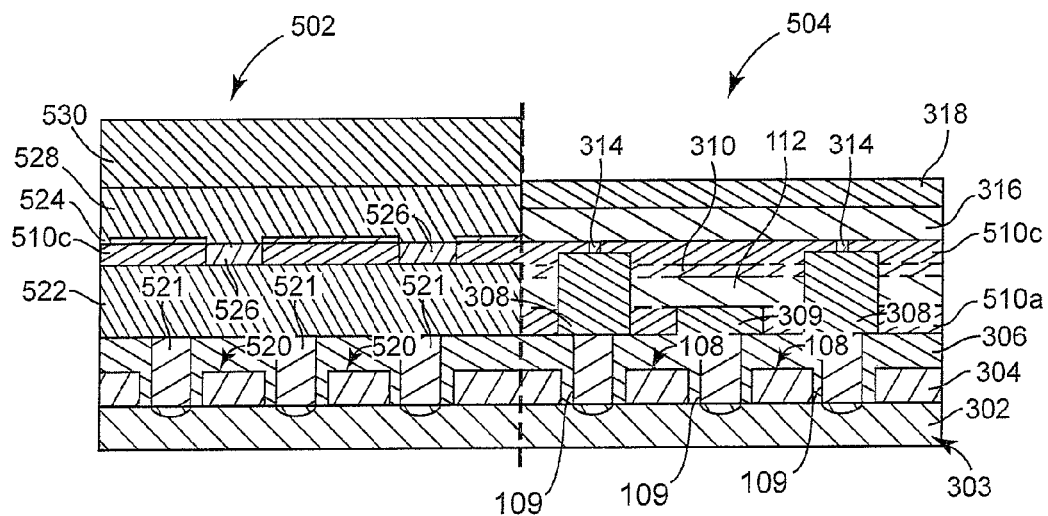
FIG. 23 illustrates a cross-sectional view of one embodiment of the logic portion and the memory array portion after further processing.

FIG. 23 illustrates a cross-sectional view of one embodiment of logic portion 502 and memory array portion 504 after depositing plate of phase change material 316 and conductive plate 318. A phase change material, such as a chalcogenide compound or other suitable phase change material is deposited over heater contacts 314 and dielectric material layer 510c on memory array portion 504 to provide plate of phase change material 316. Electrode material, such as TiN, TaN, W, Al, Cu, TiSiN, TaSiN, or other suitable electrode material is deposited over plate of phase change material 316 to provide conductive plate 318. After depositing conductive plate 318, memory array portion 504 is similar to memory device 300 previously described and illustrated with reference to FIGS. 9A-9C.

Figure 24:
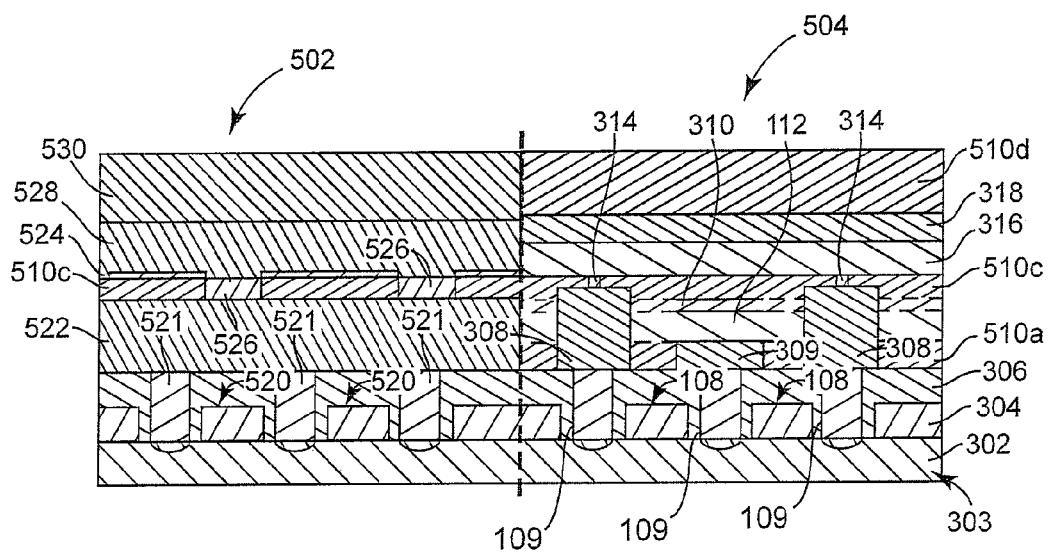
FIG. 24 illustrates a cross-sectional view of one embodiment of the logic portion and the memory array portion after further processing.

FIG. 24 illustrates a cross-sectional view of one embodiment of logic portion 502 and memory array portion 504 after depositing a dielectric material layer 510d. Dielectric material, such as $SiO_2$, FSG, BPSG, or other suitable dielectric material is deposited over conductive plate 318 and third metal layer 530. The dielectric material is then planarized to expose third metal layer 530 and to provide dielectric material layer 510d.

Figure 25:
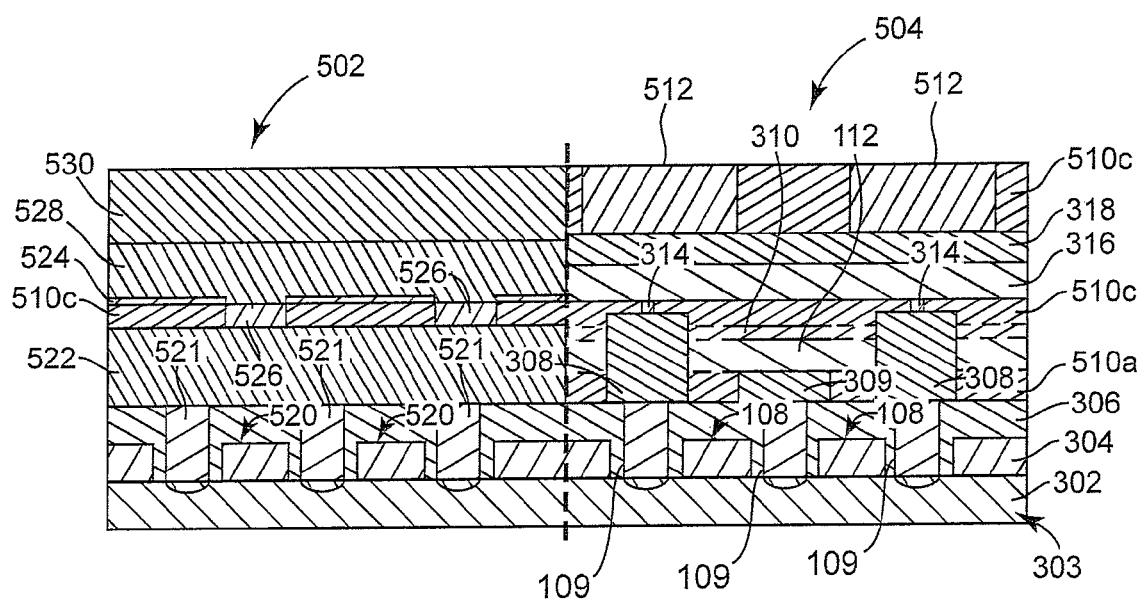
FIG. 25 illustrates a cross-sectional view of one embodiment of the logic portion and the memory array portion after further processing.

FIG. 25 illustrates a cross-sectional view of one embodiment of logic portion 502 and memory array portion 504 after forming contact plugs 512 in dielectric material layer 510d. Dielectric material layer 510d is etched to expose portions of conductive plate 318 and to provide dielectric material layer 510e. A contact material, such as W, Cu, Al, or other suitable contact material is deposited over exposed portions of conductive plate 318 and planarized and/or etched to form contact plugs 512. A metal, such as W, Cu, Al, or other suitable metal is deposited over third metal layer 510, dielectric material layer 510e, and contact plugs 512 to provide top metal layer 532 and memory device 500 previously described and illustrated with reference to FIG. 16. Therefore, except for top metal layer 532, logic portion 502 is fabricated prior to plate of phase change material 316. In this way, the BEOL process has a minimal impact on the temperature budget and reduces the oxidation risk of plate of phase change material 316.

Embodiments of the present invention provide a process including reduced BEOL processing steps for resistive memory technologies. By first processing the majority of the logic portion of a memory chip and then forming the resistive memory storage locations for the memory array portion, the BEOL process has a minimal effect on the temperature budget and reduces the oxidation risk for the resistive storage material.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit comprising:
   a logic portion comprising M conductive layers;
   a memory portion comprising N conductive layers; and
   at least one common top conductive layer over the logic portion and the memory portion,
   wherein M is greater than N.

2. The integrated circuit of claim 1, wherein the memory portion comprises a resistive memory array.

3. The integrated circuit of claim 2, wherein the resistive memory array comprises a phase change memory array.

4. The integrated circuit of claim 2, wherein the resistive memory array comprises a conductive bridging random access memory array.

5. The integrated circuit of claim 3, wherein the phase change memory array includes a plate of phase change material and heater contacts contacting the plate of phase change material.

6. The integrated circuit of claim 3, wherein the phase change memory array includes a plate of phase change material and phase change elements contacting the plate of phase change material.

7. The integrated circuit of claim 4, wherein the conductive bridging random access memory array includes a conductive bridging random access memory active layer and contacts contacting the active layer.

8. An integrated circuit comprising:
   a logic portion comprising K conductive layers; and
   a memory portion comprising a storage layer and J conductive layers below the storage layer,
   wherein the storage layer is coplanar with a J+1 conductive layer of the logic portion.

9. The integrated circuit of claim 8, wherein the memory portion comprises a resistive memory array.

10. The integrated circuit of claim 9, wherein the resistive memory array comprises a phase change memory array.

11. The integrated circuit of claim 9, wherein the resistive memory array comprises a conductive bridging random access memory array.

12. The integrated circuit of claim 10, wherein the phase change memory array includes a plate of phase change material and heater contacts contacting the plate of phase change material.

13. The integrated circuit of claim 10, wherein the phase change memory array includes a plate of phase change material and phase change elements contacting the plate of phase change material.

14. The integrated circuit of claim 11, wherein the conductive bridging random access memory array includes a conductive bridging random access memory active layer and contacts contacting the active layer.

15. A semiconductor memory device comprising:
   a logic portion comprising K conductive layers, first active devices, and first contacts coupling the first active devices to the conductive layers; and
   a resistive memory array portion comprising a resistive memory material layer, J conductive layers below the resistive memory material layer, second active devices, and second contacts coupling the second active devices to the resistive memory material layer, the resistive memory material layer coplanar with a J+1 conductive layer of the logic portion.

16. The memory device of claim 15, wherein the resistive memory material layer comprises a phase change material layer.

17. The memory device of claim 15, wherein a storage location is provided at an interface of each second contact and the resistive memory material layer.

18. The memory device of claim 17, wherein each second contact comprises a ring contact.

19. The memory device of claim 17, wherein each second contact comprises a cylindrical contact.

20. The memory device of claim 17, wherein each second contact comprises a heater contact.

* * * * *